United States Patent [19]

Fujiyama et al.

[11] Patent Number: 4,545,328

[45] Date of Patent: Oct. 8, 1985

[54] PLASMA VAPOR DEPOSITION FILM FORMING APPARATUS

[75] Inventors: Yasutomo Fujiyama; Shotaro Okabe, both of Kawasaki, Japan

[73] Assignee: Canon Kabushiki Kaisha, Tokyo, Japan

[21] Appl. No.: 647,608

[22] Filed: Sep. 6, 1984

[30] Foreign Application Priority Data

Sep. 9, 1958 [JP] Japan .................................. 58-168377

[51] Int. Cl.$^4$ ............................................. C23L 13/08
[52] U.S. Cl. .................................. 118/723; 118/50.1; 118/719; 427/39
[58] Field of Search ...................... 118/719, 723, 50.1, 118/730, 715, 692; 427/39, 74; 430/128; 204/298

[56] References Cited

U.S. PATENT DOCUMENTS

| | | | |
|---|---|---|---|
| 4,226,208 | 10/1980 | Nishida et al. | 118/719 X |
| 4,369,730 | 1/1983 | Izu et al. | 118/723 |
| 4,466,380 | 8/1984 | Jansen et al. | 118/723 X |
| 4,482,419 | 11/1984 | Tsukada et al. | 204/298 |

FOREIGN PATENT DOCUMENTS 3217708 12/1982 Fed. Rep. of Germany .
2114160 8/1983 United Kingdom .

Primary Examiner—John D. Smith
Assistant Examiner—Bernard F. Plantz
Attorney, Agent, or Firm—Fitzpatrick, Cella, Harper & Scinto

[57] ABSTRACT

In a vapor deposition film forming apparatus having a plurality of reactors each having a substrate and an electrode oppositely arranged in a vacuum chamber and means for applying a voltage thereacross to react or decompose reaction gas introduced into the vacuum chamber, the reactors are arranged on a circumference of a circle and reaction gas supply pipes having substantially equal supply resistance radially extend to the reactors from a gas reservoir located at the center of the circle.

2 Claims, 4 Drawing Figures

PLASMA VAPOR DEPOSITION FILM FORMING APPARATUS

BACKGROUND OF THE INVENTION

1. Field of the Invention

The present invention relates to an improvement in a vapor deposition film forming apparatus, and more particularly to an improvement in an apparatus for forming a photo-conductive film, a semiconductor film, an inorganic insulative film or an organic resin film on a conductive substrate by a plasma CVD method.

2. Description of the Prior Art

In a prior art apparatus for forming an electrophotographic photo-conductive drum by depositing an amorphous silicon photo-conductive film on a cylindrical metal substrate surface such as an aluminum surface by a plasma CVD method, a cylindrical cathode electrode which is coaxial with the substrate is arranged so that a glow discharge occurs between the electrode and the substrate. An example of such an apparatus is shown in FIG. 1 in a longitudinal sectional view. Numeral 11 denotes a cylindrical cathode electrode which is coaxial with a cylindrical substrate (anode electrode) 12. Numeral 13 denotes a doughnut-shaped electrical insulator, numeral 14 denotes a vacuum chamber wall, numeral 15 denotes an RF power supply, numeral 16 denotes a reaction gas discharge pipe, numeral 17 denotes a vacuum exhaust pipe, numeral 18 denotes a substrate heater, numeral 19 denotes a substrate rotating mechanism and numeral 20 denotes ground.

In this apparatus, since one substrate is arranged in one reactor, distribution of thickness of the amorphous silicon film which is easily affected by a gas flow path can be readily adjusted, and an excellent film characteristic is obtained because of excellent discharge stability.

In a mass-production by such an apparatus, it is necessary to increase the number of reactors. It is usually required for independent control of discharge parameter to provide a reaction gas supply system, a vacuum exhaust system and an RF power supply separately for each reactor. FIG. 2 shows a diagram of a multi-reactor apparatus in which four reactors are used. Numeral 1 denotes a reactor, numeral 2 denotes a matching circuit, numeral 3 denotes an RF power supply, numeral 4 denotes a coaxial cable, numeral 5 denotes a vacuum pump, numeral 6 denotes an exhaust pipe, numeral 7 denotes a reaction gas flow rate controller and numeral 8 denotes a reaction gas supply pipe.

As the number of reactors increases as shown in FIG. 2, associated facilities also increase proportionally and the parameters must be controlled for each reactor. Thus, in the prior art apparatus, it has been inevitable that the increase of the number of reactors increased the associated facilities and complicated the control operation.

When a number of deposition films are to be formed, if the RF power supply, matching circuit and coaxial cable are separately arranged for each reactor as was done in the prior art apparatus, the discharge parameters can be independently controlled but impedance matching should be individually adjusted and it is difficult to form the deposition films with the same condition in the respective reactors.

Further, the more the deposition films to be formed are, the more are the reactors as well as the RF power supply system facilities including the RF power supplies for supplying RF powers to the reactors and the matching circuits for matching the impedances of the RF glow discharges required.

SUMMARY OF THE INVENTION

It is a object of the present invention to provide a vapor deposition film forming apparatus having a plurality of reacotrs which does not require additional associated facilities and does not complicate the control operation as the number of reactors increases.

It is another object of the present invention to provide a vapor deposition film forming apparatus having a substantially equal reaction gas supply resistance in each of reactors.

It is other object of the present invention to provide a vapor deposition film forming apparatus having a plurality of reactors for forming deposition films on substrates by arranging the substrates and opposing electrodes in vacuum chambers and applying voltages thereacross to react or decompose reaction gas introduced into the vacuum chambers, wherein center axes of the reactors are arranged on a circumference of a circle and reaction gas supply pipes having an equal supply resistance radially extends from a gas reservoir located at a center of the circle to the respective reactors.

DETAILED DESCRIPTION OF THE PREFERRED EMBODIMENT

Figure 3:
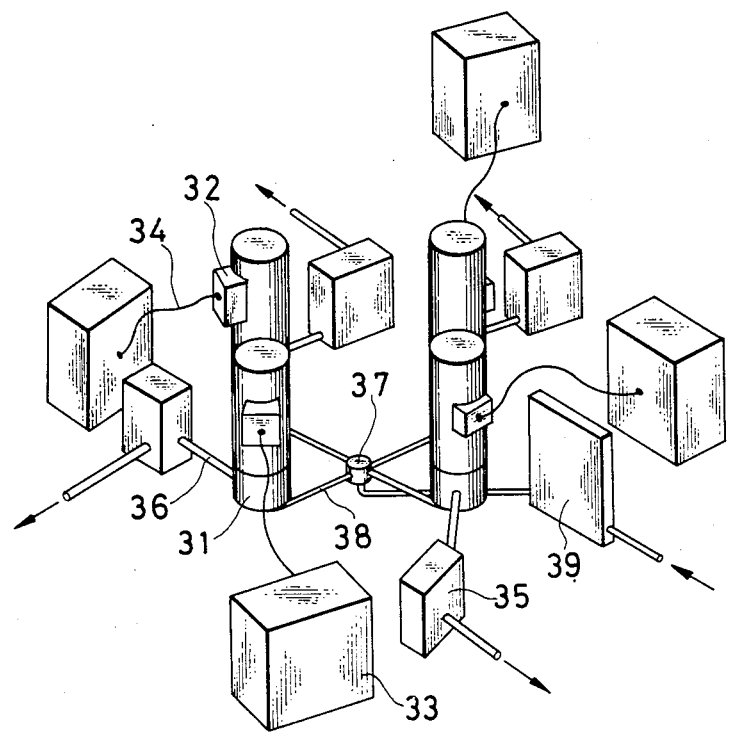
FIG. 3 is a diagram of an apparatus of the present invention.
Figure 4:
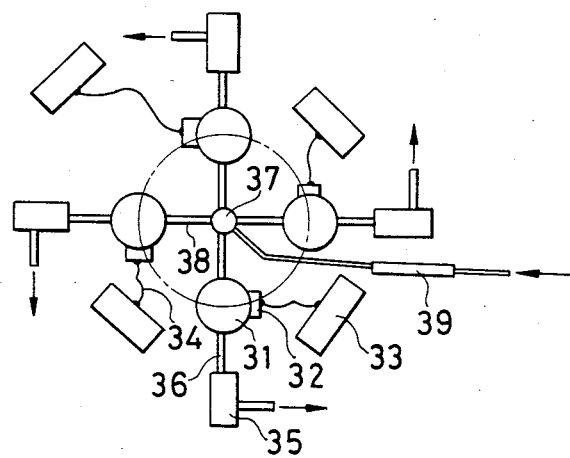
FIG. 4 is a plan view of the apparatus of FIG. 3.

FIG. 3 is a diagram of a vapor deposition film forming apparatus of the present invention having four reactors, and FIG. 4 is a plan view thereof.

Figure 1:
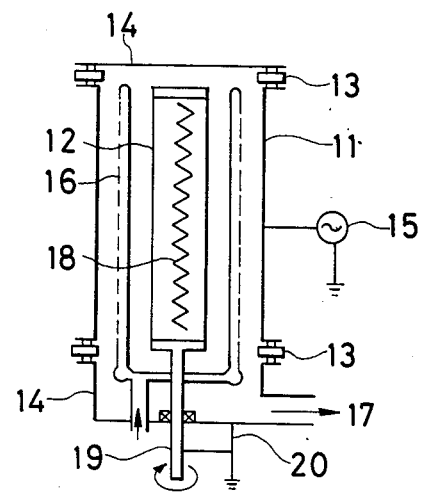
FIG. 1 is a longitudinal sectional view of a reactor of a vapor deposition film forming apparatus.
Figure 2:
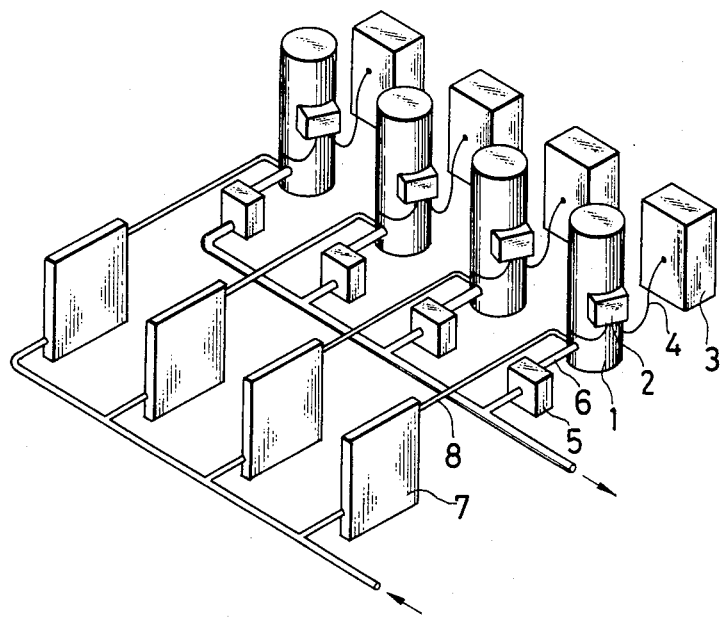
FIG. 2 is a diagram of a prior art apparatus for mass-producing deposition films.

Numeral 31 denotes a reactor similar to that shown in FIG. 1. Four such reactors are arranged on a circumference of a circle. In each reactors, there are provided a matching circuit 32 for matching an impedance, an RF power supply 33 for supplying a glow discharge power, a coaxial cable 34 for connecting the matching circuit 32 to the RF power supply 33, a vacuum pump 35 for vacuuming the reactor and an exhaust pipe 36. A reaction gas supply unit comprises a gas reservoir 37 located at a center of the circle on which the reactors are arranged, reaction gas supply pipes 38 for supplying reaction gas to the reactors from the gas reservoir and a reaction gas flow rate controller 39 for controlling a flow rate of the reaction gas supplied to the reactors.

In order to form deposition films by the apparatus shown in FIGS. 3 and 4, deposition chambers in the reactors are vacuumed to $10^1$–$10^{-3}$ torr, and reaction gas for forming the deposition films and necessary carrier gas or dopant gas for introducing impurities into the films to be formed are introduced at desired pressure and flow rate. For example, in order to form hydrogenated amorphous silicon (a-Si:H) films on substrates, $SiH_4$ gas, $Si_2H_6$ gas or combination of those gases and appropriate amount of $H_2$, He or Ar is introduced into the deposition chambers. The deposition chambers are vacuumed in accordance with the above process, the substrate temperature is set to 200°–400° C., gas mixture consisting of 5–40% by volume of $SiH_4$ and 95–60% by volume of $H_2$ is introduced into the deposition chambers at a gas pressure of 0.1–2 torr and at a gas flow rate of 0.1–2 l/min, an RF power is applied to the cathode electrodes from the RF power supply through the matching circuit to excite glow discharges, and the reaction gas is decomposed to form the a-Si:H films on the substrates.

The present apparatus has many advantages as described above. It is preferable to provide a reaction gas flow rate control valve in a reaction gas supply common pipe which supplies to reaction gas to the gas reservoir so that the reaction gas flow rate remains unchanged even if the number of reactors in operation changes.

As described above, in accordance with the present invention, the structure of the prior art reactor is not modified but a plurality of such reactors are arranged on the circle and the reaction gas supply pipes radially extend to the reactors from the gas reservoir located at the center of the circle. Accordingly, the apparatus and the control are simplified.

The number of reactors may be increased by simply increasing the radius of the circle along which the reactors are arranged.

The reaction gas supply unit comprises the gas reservoir, the reaction gas supply pipes and the reaction gas flow rate controller. The diameters, shapes and lengths of the reaction gas supply pipes are selected such that the reaction gas is supplied to the respective reactors under the same condition. Preferably, the diameters, shapes and lengths are selected to be identical.

The gas reservoir may also serve as a gas reservoir for the reaction gas supply common pipe.

In the present invention, only the reaction gas supply unit is shared by the reactors. Alternatively, the RF power supply, the matching circuit for matching the impedance of the glow discharge and the exhaust system may be shared.

A source gas may be silane ($SiH_4$, $Si_2H_6$, $Si_3H_8$, $Si_4H_{10}$) as amorphous silicon film forming material, $H_2$ as base gas, rare gas, $SiF_4$ for introducing fluorine, $B_2H_6$, $PH_3$, $AsH_3$ for controlling a p or n conductivity, $N_2$, $NH_3$ for introducing nitrogen, $N_2O$, $NO$ for introducing oxygen, hydrocarbon such as $CH_4$, $C_2H_4$ for introducing carbon or other gas known to contain atoms which can be introduced by the plasma CVD method. Those gases may be combined at predetermined proportions by a mass flow controller.

The present apparatus may be applied to form an insulative film such as $Si_3N_4$ SiC, $SiO_2$ or SiO. The present apparatus may also be applied to form an organic resin film.

An embodiment to form the a-Si:H film by the present apparatus is explained below.

The a-Si:H film was formed by the vapor deposition film forming apparatus shown in FIGS. 3 and 4 by using gas mixture of $SiH_4$ gas and $H_2$ gas as the reaction gas. The reactors were vacuumed to 1 torr by the vacuum pumps 35 and the substrates were previously heated to 300° C. The reaction gas was controlled by the reaction gas flow rate controller such that the $SiH_4$ gas flow rate was 400 cc/min and the $H_2$ gas flow rate was 800 cc/min and the gas pressure was 0.5 Torr. The reaction gas was introduced through the reaction gas supply pipes 38 so that the gas was stably supplied to the deposition chambers. The RF power of 100 watts at the frequency of 13.56 MHz was applied to the cathode electrodes from the RF power supply 33 to generate glow discharges between the cathodes and the grounded substrates to form the a-Si:H films on the substrates.

The formed a-Si:H films had as excellent dark resistance characteristic and photo-conductive characteristic and uniform films as those formed by the prior art single-reactor apparatus shown in FIG. 1.

What we claim is:

1. A vapor deposition film forming apparatus having a plurality of reactors each having a substrate and an electrode oppositely arranged in a vacuum chamber and means for applying a voltage thereacross to react or decompose reaction gas introduced into said vacuum chamber, characterized by that center axis of said reactors are arranged on a circumference of a circle and reaction gas supply pipes having substantially equal supply resistance radially extend to said reactors from a gas reservoir located at a center of said circle.

2. A vapor deposition film forming apparatus according to claim 1 wherein a reaction gas flow rate control valve is provided in a reaction gas supply common pipe for supplying the reaction gas to said gas reservoir.

* * * * *

UNITED STATES PATENT AND TRADEMARK OFFICE
CERTIFICATE OF CORRECTION

PATENT NO. : 4,545,328                                     Page 1 of 2
DATED     : October 8, 1985
INVENTOR(S) : YASUTOMO FUJIYAMA, ET AL.

It is certified that error appears in the above-identified patent and that said Letters Patent is hereby corrected as shown below:

Col. 1, line 37, change "In a mass-production by such an apparatus" to --For mass-production by such an apparatus--.

Col. 1, line 40, "parameter" to provide a reaction gas supply system" should be --parameters to provide a reaction gas supply system--.

Col. 1, lines 63-64 "condition in the respective reactors." should be --Conditions in the respective reactors.--.

Col. 1, line 65, "Further, the more the deposition films to be formed" should be --Further, the greater the number of the deposition films to be formed.--

Col. 2, line 5, "It is a object of the present invention" should be --It is an object of the present invention--.

Col. 2, line 7, "plurality of reacotrs" should be --plurality of reactors--.

Col. 2, line 14, "It is other object" should be --It is another object--.

Col. 2, line 21, "reactors are arranged on a circumference" should be --reactors are arranged on the circumference--.

Col. 2, line 23, "radially extends" should be --radially extend--.

Col. 2, line 24, "located at a center of the circle" should be --located at the center of the circle--.

Col. 1, line 66, delete "are" (first occurrence).

UNITED STATES PATENT AND TRADEMARK OFFICE
CERTIFICATE OF CORRECTION

PATENT NO. : 4,545,328

DATED : October 8, 1985

INVENTOR(S) : YASUTOMO FUJIYAMA, ET AL.

It is certified that error appears in the above-identified patent and that said Letters Patent is hereby corrected as shown below:

Col. 2, line 43, "Four such reactors are arranged on a" should be --Four such reactors are arranged on the--.

Col. 2, line 51, "at a center" should be --at the center--.

Col. 2, line 54, "for controlling a" should be --for controlling the--.

Col. 4, line 37, "characterized by that center axis of said reactors are" should be --wherein center axes of said reactors are--.

Col. 4, line 38, "arranged on a circumference" should be --arranged on the circumference--.

Col. 4, line 41, "at a center" should be --at the center--.

Signed and Sealed this

Fourth Day of November, 1986

[SEAL]

Attest:

DONALD J. QUIGG

*Attesting Officer*       *Commissioner of Patents and Trademarks*